United States Patent
Wu et al.

(10) Patent No.: US 9,160,305 B1
(45) Date of Patent: Oct. 13, 2015

(54) CAPACITIVELY AND PIEZOELECTRICALLY TRANSDUCED MICROMECHANICAL RESONATORS

(71) Applicants: I-Tsang Wu, Tampa, FL (US); Julio Mario Dewdney, Greensboro, NC (US); Jing Wang, Tampa, FL (US)

(72) Inventors: I-Tsang Wu, Tampa, FL (US); Julio Mario Dewdney, Greensboro, NC (US); Jing Wang, Tampa, FL (US)

(73) Assignee: University of South Florida, Tampa, FL (US)

( * ) Notice: Subject to any disclaimer, the term of this patent is extended or adjusted under 35 U.S.C. 154(b) by 65 days.

(21) Appl. No.: 14/050,860

(22) Filed: Oct. 10, 2013

Related U.S. Application Data

(60) Provisional application No. 61/711,876, filed on Oct. 10, 2012.

(51) Int. Cl.
    *H03H 9/50*     (2006.01)
    *H03H 9/54*     (2006.01)
    *H03H 3/04*     (2006.01)

(52) U.S. Cl.
CPC *H03H 9/542* (2013.01); *H03H 3/04* (2013.01)

(58) Field of Classification Search
USPC .......... 333/186–189, 191; 310/311, 321, 348, 310/349
See application file for complete search history.

(56) References Cited

U.S. PATENT DOCUMENTS

| | | | |
|---|---|---|---|
| 3,648,184 A * | 3/1972 | Fujishima et al. | 329/328 |
| 6,215,229 B1 * | 4/2001 | Kuroda et al. | 310/366 |
| 7,994,877 B1 * | 8/2011 | Kubena et al. | 333/187 |
| 8,513,864 B2 * | 8/2013 | Ho | 310/351 |

OTHER PUBLICATIONS

Abdelmonetum, et al., "Stemless wine-glass-mode disk micromechanical resonators", IEEE The Sixteenth Annual International Conference on, 698-701, 2003.

Abdolvand, et al., "High-frequency monolithic thin-film piezoelectric-on-substrate filters", International Journal of Microwave and Wireless Technologies 1(1):29-35, 2009.

Abdolvand, et al., "A gap reduction and manufacturing technique for thick oxide mask layers with multiple-size sub-um openings", Journal of Microelectromechanical Systems, 15:5 1139-1144, 2006.

Benaissa, et al., "RF CMOS on high-resistivity substrates for system-on-chip applications", IEEE Transactions on Electron Devices, 50:3 567-576, 2003.

Clark, et al., "High-Q VHF micromechanical contour-mode disk resonators", IEEE Int. Electron Devices Meeting, San Francisco, 399-402, 2000.

Hao, et al., "VHF single-crystal silicon elliptic bulk-mode capacitive disk resonators—part I: design and modeling", Journal of Microelectromechanical Systems, 13:6 1043-1053, 2004.

Jenkins, "Substrate coupling noise issues in silicon technology", Topical Meeting on Silicon Monolithic Integrated Circuits in RF Systems, 91-94, 2004.

Lakin, et al., "UHF composite bulk wave resonators", IEEE Ultrasonics Symposium, 834-837, 1980.

Lin, et al., "Vibrating micromechanical resonators with solid dielectric capacitive transducer gaps", Proceedings of the 2005 IEEE International Frequency Control Symposium and Exposition, 128-134, 2005.

(Continued)

*Primary Examiner* — An Luu
(74) *Attorney, Agent, or Firm* — Thomas | Horstemeyer, LLP

(57) ABSTRACT

In one embodiment, a hybrid micromechanical resonator includes a capacitive resonator element and a piezoelectric resonator element, wherein the resonator can be capacitively and piezoelectrically transduced.

19 Claims, 6 Drawing Sheets

(56) References Cited

OTHER PUBLICATIONS

Nathanson, et al., "The resonant gate transistor", IEEE Transactions on Electron Devices, ED-14:3, 117-133, 1967.

Nguyen, et al., "Polysilicon microresonators for signal processing", Digest of Paper, Government Microcircuit and Applications Conference, San Diego, 195-198, 1994.

Piazza, "One and two part piezoelectric higher order contour-mode MEMS resonators for mechanical signal processing", Solid State Electronics, 51:11-12 1596-1608, 2007.

Piazza, et al., "Two-part stacked piezoelectric aluminum nitride contour-mode resonant MEMS", Sensors and Actuators A—Physical, 136:2 638-645, 2007.

Pourkamali, et al., "VHF single crystal silicon capacitive elliptic buld-mode disk resonators—part II: implementation and characterization", Journal of Microelectromechanical Systems, 13:6 1054-1062, 2004.

Pourkamali, et al., "High-Q single crystal silicon HARPSS capacitive beam resonators with self-aligned sub-100-nm transduction gaps", Journal of Microelectromechanical Systems, 12:4 487-496, 2003.

Rong, et al., "Surface-passivated high-resistivity silicon substrates for RFICs", IEEE Electron Device Letters, 25:4 176-178, 2004.

Satoh, et al., "Development of piezoelectric thin film resonator and its impact on future wireless communication systems", Japanese Journal of Applied Physics, 44:5A 2883-2894, 2005.

Stephanou, et al., "Piezoelectronic aluminum nitride MEMS annular dual contour mode filter", Sensors and Actuators, A134 152-160, 2007.

Wang, et al., "1.156-GHz self-aligned vibrating micromechanical disk resonator", IEEE Transactions on Ultrasonics, Ferroelectrics, and Frequency Control, 51:12 1607-1628, 2004.

Wang, et al., "VHF free-free beam high-Q micromechanical resonators", Journal of Microelectromechanical Systems, 9:3 347-360, 2000.

Weinstein, et al., "Internal dielectric transduction in bulk-mode resonators", Journal of Microelectromechanical Systems, 18:6 1401-1408, 2009.

Wong, et al., "Micromechanical mixer-filters ("mixlers")", Journal of Microelectromechanical Systems, 13:1 100-112, 2004.

Wu, et al., "An equivalent circuit model for a faraday cage substrate crosstalk isolation structure", IEEE Radio Frequency Integrated Circuits Symposium, 635-638, 2004.

Wu, et al., "A through-wafer interconnect in silicon for RFICs", IEEE Transactions on Electron Devices, 51:11 1765-1771, 2004.

\* cited by examiner

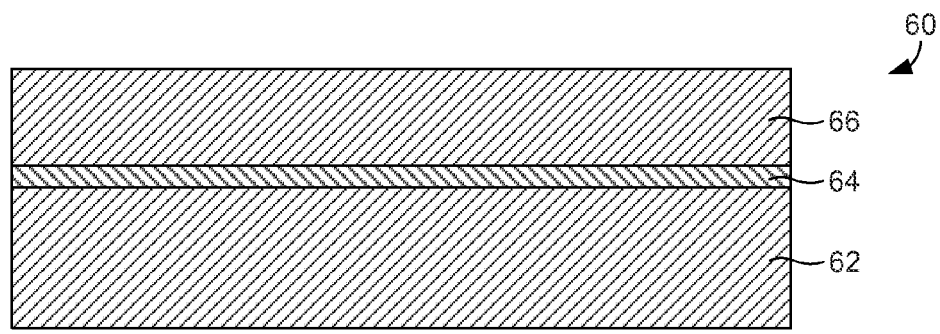
FIG. 4A
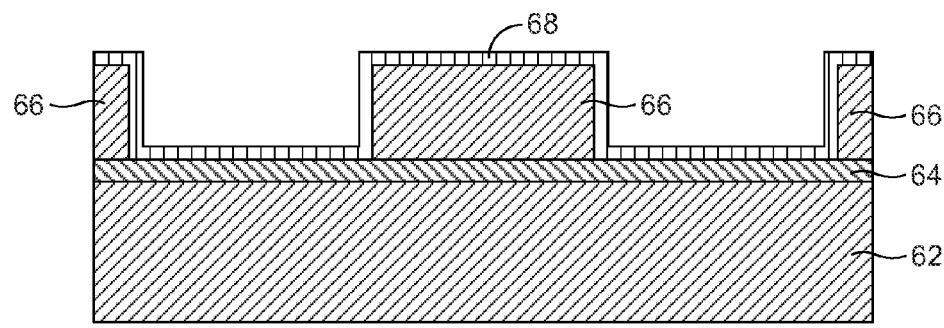
FIG. 4B
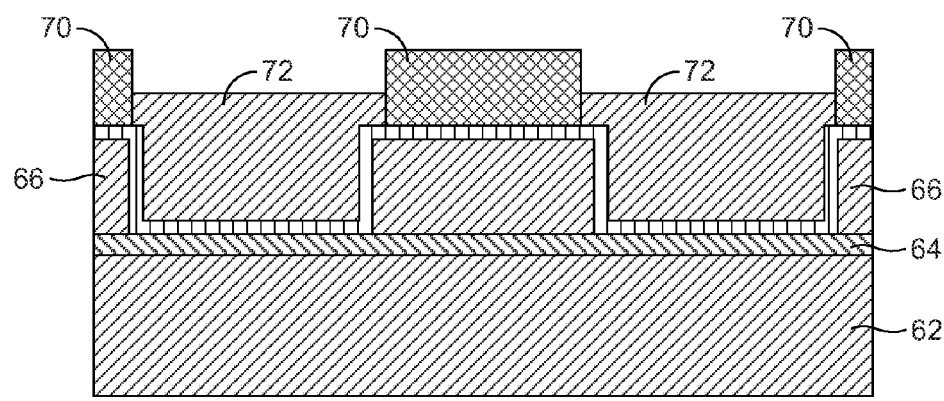
FIG. 4C.1

FIG. 4C.2

CAPACITIVELY AND PIEZOELECTRICALLY TRANSDUCED MICROMECHANICAL RESONATORS

CROSS-REFERENCE TO RELATED APPLICATION(S)

This application claims priority to U.S. Provisional Application Ser. No. 61/711,876, filed Oct. 10, 2012, which is hereby incorporated by reference herein in its entirety.

NOTICE OF GOVERNMENT-SPONSORED RESEARCH

This invention was made with Government support under grant/contract numbers 0925929 and 2106112000 awarded by the National Science Foundation (NSF). The Government has certain rights in the invention.

BACKGROUND

Due to the rapid growth in personal mobile communication devices, the wireless market is always looking for new ways to further miniaturize radio frequency (RF) front ends while reducing cost and power consumption. For many years, wireless transceivers and subsystems have relied upon high quality factor (Q) passives to implement oscillators, filters, and other key RF front-end circuitry elements. However, these discrete, off-chip components occupy large chip areas and require power-demanding interfacing circuits. As a result, a great deal of research effort has been devoted to the development of micromechanical resonators that are more amenable to direct integration with integrated circuits (ICs).

In the past few years, vibrating RF micro-electrical-mechanical-system (MEMS) resonator technology has emerged as a viable solution, most notably, the film bulk acoustic resonator (FBAR) and surface acoustic wave (SAW) resonator, which have already been successfully implemented into commercial products. Such micromechanical resonators can perform as well as, if not better than, their bulky conventional counterparts and facilitate the miniaturization and power reduction of conventional RF systems. However, these devices typically cannot be used when multi-frequency functionality on a single chip is needed.

Contour-mode MEMS resonators have been developed to address this issue. Unlike FBARs and SAW resonators, contour-mode resonators use lateral dimensions to define their resonating frequencies, thus enabling single-chip, multi-frequency functionality. However, there is still room for improvement with respect to lowering the motional resistance of these devices to enable matching to 50Ω electronics, while retaining low power consumption, small size, and simple manufacturing processes.

BRIEF DESCRIPTION OF THE DRAWINGS

The present disclosure may be better understood with reference to the following figures. Matching reference numerals designate corresponding parts throughout the figures, which are not necessarily drawn to scale.

FIGS. 4A-4I are sequential cross-sectional drawings illustrating steps in an embodiment of a method for fabricating a hybrid micromechanical resonator, such as that shown in FIGS. 1-3.

DETAILED DESCRIPTION

Figure 1:
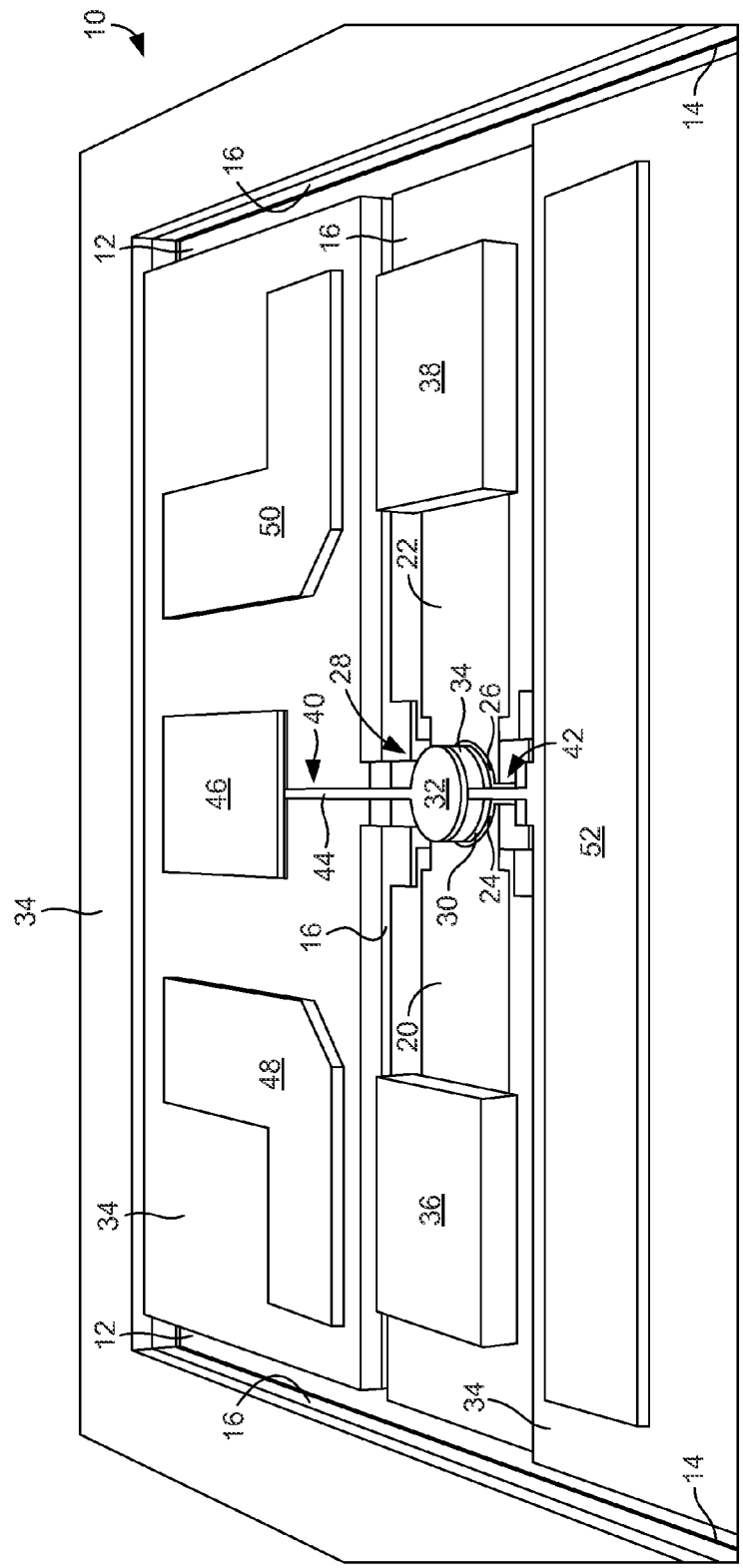
FIG. 1 is a perspective view of an embodiment of a hybrid micromechanical resonator that incorporates both capacitive and piezoelectric transduction.

As described above, it would be desirable to have micromechanical resonators that enable single-chip, multi-frequency functionality but that have higher motional resistance than existing micromechanical resonators. Disclosed herein are micromechanical resonators that satisfy those criteria. The micromechanical resonators incorporate both capacitive and piezoelectric features that enable both capacitive and piezoelectric transduction. Because the resonators incorporate both capacitive and piezoelectric features, they combine the benefits of both capacitive and piezoelectric resonators.

In the following disclosure, various specific embodiments are described. It is to be understood that those embodiments are example implementations of the disclosed inventions and that alternative embodiments are possible. All such embodiments are intended to fall within the scope of this disclosure.

Two of the most widely-studied on-chip micro resonator technologies leverage either capacitive (electrostatic) or piezoelectric transducers. Capacitively transduced resonators exhibit better temperature coefficients and on/off self-switching capability, and generally exhibit much higher quality factor (Q) at high frequencies. Capacitively transduced resonators have been demonstrated at operating frequencies of up to 6.2 GHz while still exhibiting a Q higher than 4,000. Unfortunately, capacitively transduced resonators also exhibit extremely high motional impedance that hinders their implementation into current wireless communication infrastructure.

Unlike capacitively transduced resonators, piezoelectrically transduced resonators can be produced to have a 50Ω matched motional impedance. Filters using piezoelectric material have shown insertion losses as low as 3 dB. Unfortunately, piezoelectrically transduced resonators lack the high Q of capacitively transduced resonators.

Table 1 summarizes many of the characteristics of capacitive and piezoelectric resonators.

TABLE 1

Summarized characteristics for capacitive and piezoelectric transduced resonators.

|  | Capacitive | Piezoelectric |
|---|---|---|
| Quality factor | High | Moderate |
| Fabrication | Complicate | Relatively easy |
| Motional impedance | High | Low |
| Signal feedthrough | Moderate to high | Moderate to high |
| Reconfigurability | DC bias On/Off | None |
| Material selection | Most of the conductive materials | Only mainstream piezo materials |
| Thermal stability | Need to be improved | Need to be improved |

From the above discussion, it can be appreciated that capacitively transduced resonators provide advantages that piezoelectrically transduced resonators cannot provide and piezoelectrically transduced resonators provide advantages that capacitively transduced resonators cannot provide. Fortunately, the two transduction methods complement each other and, therefore, can be combined into a single hybrid micromechanical resonator. Such a hybrid resonator can provide both the low-loss acoustic characteristics of capacitively transduced resonators and the desirable electromechanical coupling characteristics of piezoelectrically transduced resonators so as to overcome the limitations of conventional micro-electrical-mechanical-system (MEMS) resonators. Through such combination, it is possible to have a micromechanical resonator that is well suited for integration with modern wireless communication infrastructure.

Described below are embodiments of such hybrid micromechanical resonators that are both capacitively and piezoelectrically transduced. As is discussed below, silicon-on-insulator (SOI) wafers, chemical mechanical polishing (CMP), and atomic layer deposition (ALD) can be utilized to fabricate the resonators without complicating the fabrication process. Generally speaking, the hybrid resonators comprise both capacitive resonator and piezoelectric resonator features or elements. In some embodiments, the hybrid resonator is configured as a capacitive resonator having a piezoelectric resonator placed on top of the capacitive resonator body. In some embodiments, such a structure can be formed using a generally flat resonator topology.

Figure 2:
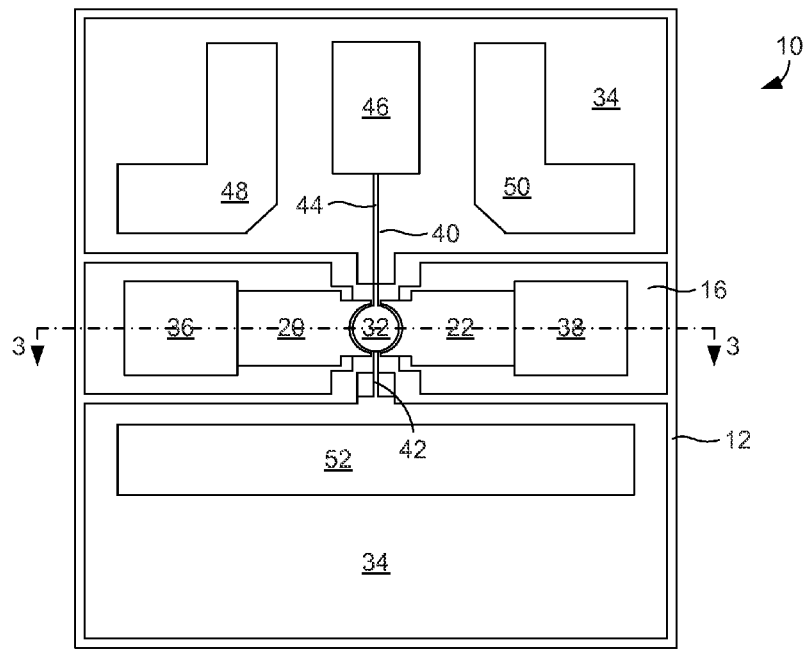
FIG. 2 is a top view of the hybrid micromechanical resonator of FIG. 1.
Figure 3:
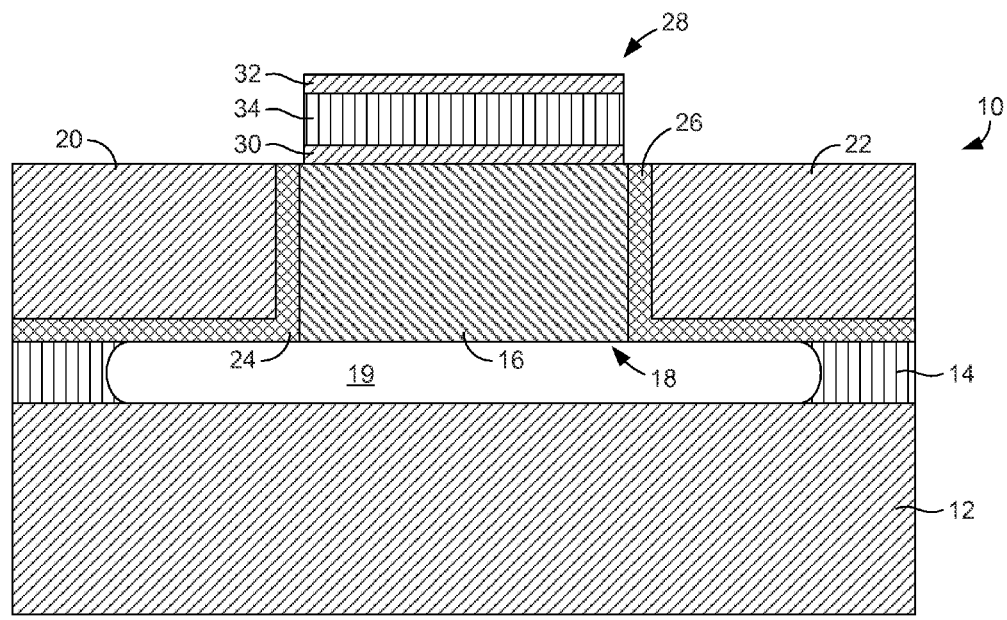
FIG. 3 is a cross-sectional view of the hybrid micromechanical resonator of FIGS. 1 and 2 taken along line 3-3 in FIG. 2.

FIGS. 1-3 illustrate an embodiment of a hybrid micromechanical resonator 10. The hybrid resonator 10 can be formed on an SOI wafer. In other embodiments, the hybrid resonator 10 can be formed on an ultra-nano crystalline diamond (UNCD) wafer. UNCD wafers comprise superior mechanical properties and therefore could be used to create resonators that have operating frequencies much higher than resonators based upon SOI wafers. In addition, UNCD wafers have better thermal stability than SOI wafers. In the remainder of the discussion of FIGS. 1-3, however, it is assumed that the hybrid resonator 10 is based upon an SOI wafer.

With particular reference to the cross-sectional view of FIG. 3, the SOI wafer comprises a stack of layers including, from bottom to top, a handle layer 12, a buried oxide layer 14, and a device layer 16, which is used to form the capacitive resonator body 18 of the device. In some embodiments, the resonator body 18 has a circular or cylindrical configuration, which is apparent from FIGS. 1 and 2. As is also shown in FIG. 3, the portion of the oxide layer 14 that lies below the resonator body 18 has been removed to form an open cavity 19 that enables resonator body to resonate (e.g., in contour mode). Positioned on opposite sides of the resonator body 18 are capacitive electrodes 20 and 22 that, for example, can be used to apply a direct current (DC) bias voltage and/or to apply an alternating current (AC) signal to the capacitive transducer between the resonator body and the side electrode(s) that corresponds to an RF signal. Positioned between the capacitive electrodes 20, 22 are layers 24 and 26 of dielectric material (or air if it is released) that form capacitive gaps that isolate the resonator body 18 from the electrodes.

The structure described above can be used as a capacitively transduced resonator. To form a hybrid resonator 10 that is capable of both capacitive and piezoelectric operation, however, a piezoelectric element is added to the structure. In the example embodiment of FIGS. 1-3, this piezoelectric element comprises a piezoelectric transducer 28 (e.g., contour-mode resonator) that is formed directly on top of the capacitive resonator body 18. Together, the capacitive resonator body 18 and the piezoelectric transducer 28 form a hybrid resonator body that is capable of capacitive and piezoelectric transduction. As shown in FIG. 3, the piezoelectric transducer 28 comprises a bottom electrode 30, a top electrode 32, and a piezoelectric layer 34 sandwiched between the two electrodes.

Other aspects of the hybrid resonator layout can be appreciated from the perspective and top views of FIGS. 1 and 2. As shown in these figures, the capacitive electrodes 20, 22 can surround the capacitive resonator body 18, which has a circular and cylindrical configuration. Formed on top of the capacitive electrodes 20, 22 are conductive pads 36 and 38 that can be used to probe the hybrid resonator 10.

As is also shown in FIGS. 1 and 2, first and second anchors 40 and 42 extend outward from the capacitive and piezoelectric resonator bodies 18, 28 in opposite directions that are perpendicular to the length directions of the capacitive electrodes 20, 22. As illustrated in FIG. 1, a branch 44 of the top electrode 32 of the piezoelectric resonator body 28 extends along the first anchor 40 to a further conductive pad 46. As is further shown in FIGS. 1 and 2, the hybrid resonator 10 can include additional conductive pads 48-52, which can also be used to probe the resonator.

FIGS. 4A-4I illustrate steps in an example method that can be used to fabricate a hybrid resonator, such as that shown in FIGS. 1-3. Beginning with FIG. 4A, an SOI wafer 60 is provided that comprises a handle layer 62, a buried oxide layer 64, and a device layer 66. In some embodiments, the handle layer 62 is composed high-resistivity silicon, which can be approximately 300 to 500 µm thick (only a portion of this thickness shown). The buried oxide layer 64 can be composed of a thermally grown oxide, such as silicon dioxide, and can be approximately 1 to 2 µm thick. The device layer 66 can be composed of a silicon material, such as single crystalline silicon, and can be approximately 5 to 20 µm thick.

Referring next to FIG. 4B, portions of the device layer 66 can be removed to create a central region that will ultimately form the capacitive resonator body. In some embodiments, the portions of the device layer 66 are patterned to define the resonator body using deep reactive ion etching (DRIE). As is apparent from FIG. 4B, the portions of the device layer 66 can be etched away until the buried oxide layer 64 is exposed on either side of the central region (resonator body). Once the etching has been completed, a layer 68 of dielectric material, such as hafnium oxide ($HfO_2$), titanium oxide ($TiO_2$), or aluminum oxide ($Al_2O_3$), can be conformally deposited over the remaining portions of the device layer 66 and the exposed buried oxide layer 64. In some embodiments, the dielectric layer 68 is deposited using atomic layer deposition (ALD). Irrespective of the deposition method, the dielectric layer 66 is very thin so that it can form the capacitive gaps to allow the capacitive transducer to have a good electromechanical coupling coefficient. In some embodiments, the dielectric layer 68 is approximately 10 to 150 nm thick. It is noted that, in some embodiments, the dielectric layer 66 can later be removed so that the capacitive gaps are air gaps.

At this point, the capacitive electrodes can be formed. In some embodiments, the electrodes can be formed by metal plating. In other embodiments, the electrodes can be formed by depositing a doped polysilicon or other conductive material. FIG. 4C.1 illustrates an example of metal plating. As shown in this figure, photoresist material 70 is first applied to the device and is patterned so as to define the shape that the capacitive electrodes will take. The structure can then be plated with a metal 72, such as copper, nickel, or gold, to position the side electrode in the cavities formed by the etching of the device layer 66. FIG. 4C.2 illustrates an example of depositing a silicon material. In this figure, a conductive material 74, such as heavily-doped polysilicon, is deposited on the structure. By way of example, the polysilicon can be deposited using low pressure chemical vapor deposition (LPCVD).

Figure 4D:
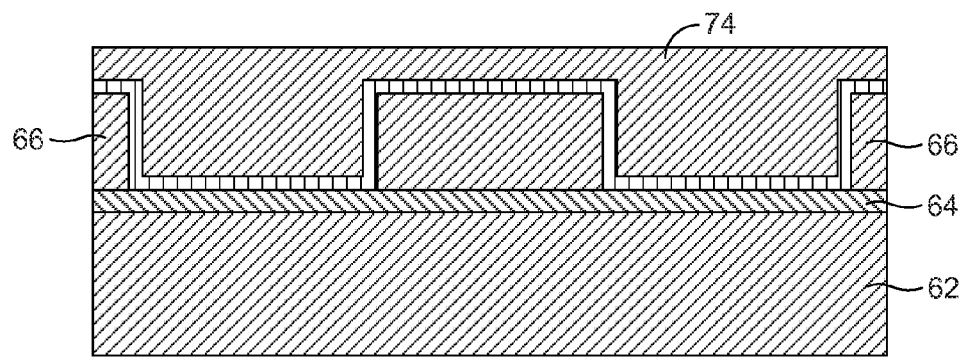
Figure 4D:
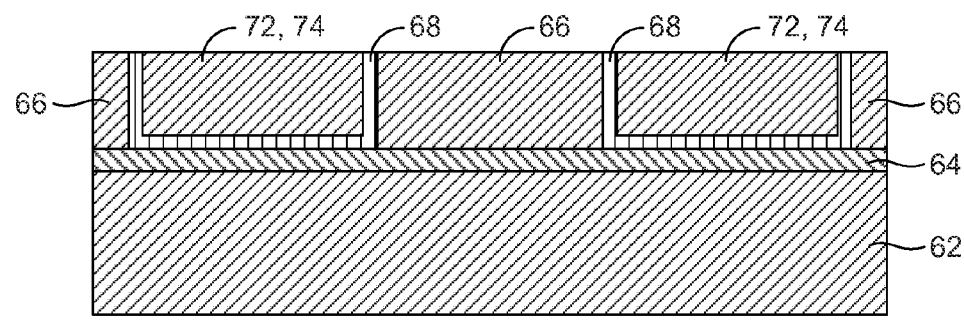
Figure 4E:
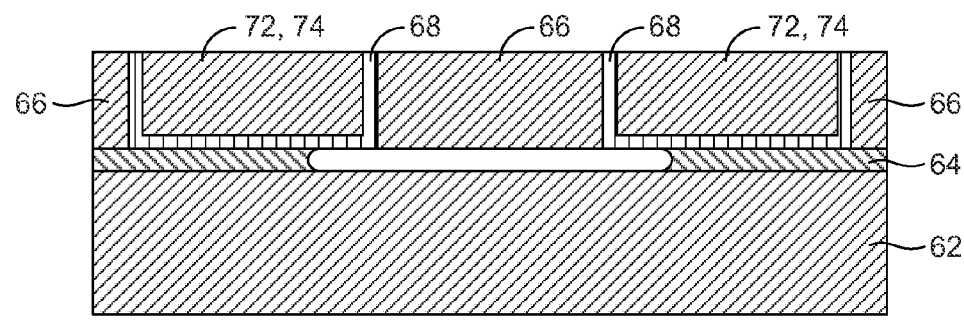

Referring next to FIG. 4D, the top of the structure can be polished until the top layer of the dielectric material 68 has been removed and the central region of the device layer (resonator body) 66 and capacitive electrodes 72, 74 are exposed. In some embodiments, chemical-mechanical polishing (CMP) is performed to remove the excess material. Next, as shown in FIG. 4E, the portion of the buried oxide layer 64 positioned under the central region of device layer 66 can be removed (e.g., by wet etching) to release the central region and form a capacitive resonator body.

Figure 4F:
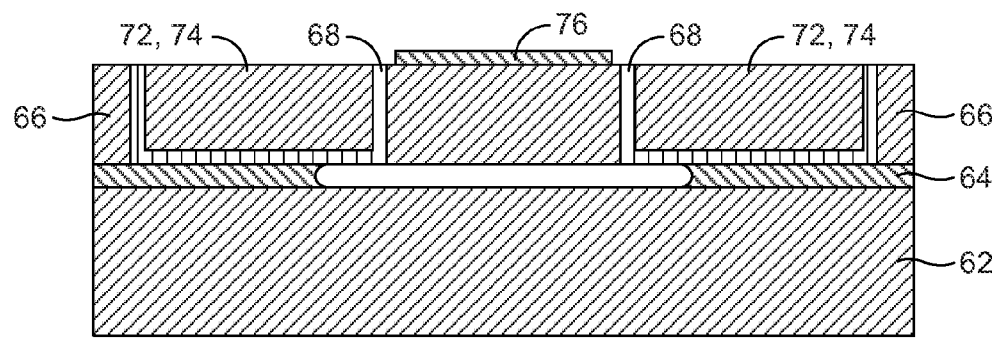

At this point, a capacitive resonator has been fabricated. To form a hybrid resonator that can be capacitively and piezoelectrically transduced, a piezoelectric transducer is formed on top of the capacitive resonator body. With reference to FIG. 4F, a bottom electrode 76 of the piezoelectric resonator body can be formed using substantially any electrically conductive material. In some embodiments, the electrode 76 can be approximately 150 to 200 nm thick.

Figure 4G:
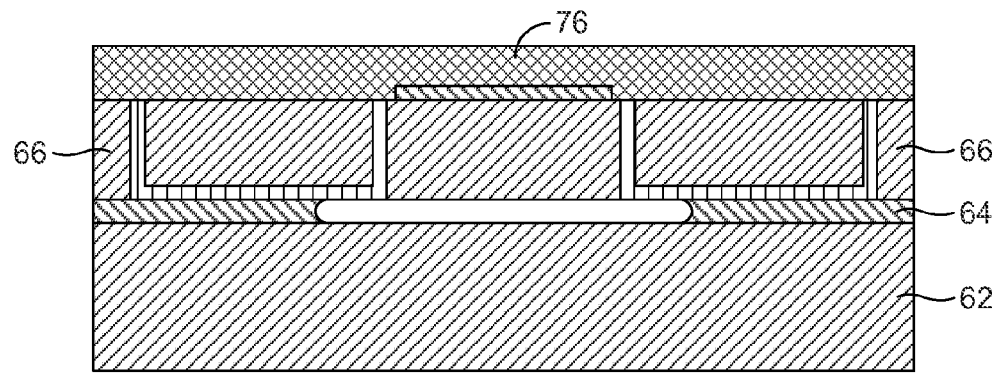

Next, a layer 78 of piezoelectric material can be deposited, as shown in FIG. 4G. By way of example, the piezoelectric material can be one or more of aluminum nitride (AlN), zinc oxide (ZnO), lead zirconate titanate (PZT), or barium titanate (BaTiO$_3$). Irrespective of the piezoelectric material that is used, the layer 78 can be approximately 0.5 to 2.0 μm thick.

Figure 4H:
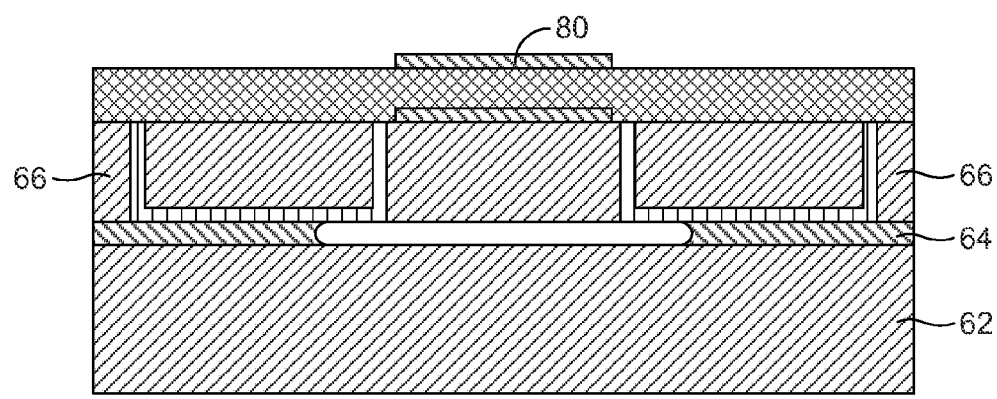

With reference to FIG. 4H, a top electrode 80 can be formed on top of the layer 78 of piezoelectric material. The top electrode 80 can be made of a low-density metal, such as aluminum, and can be approximately 150 to 200 nm. As with the capacitive resonator body, the piezoelectric transducer can be circular and cylindrical. In such a case, each of the electrodes 76, 80 can be circular (or splitted half-circular shape).

Figure 4I:
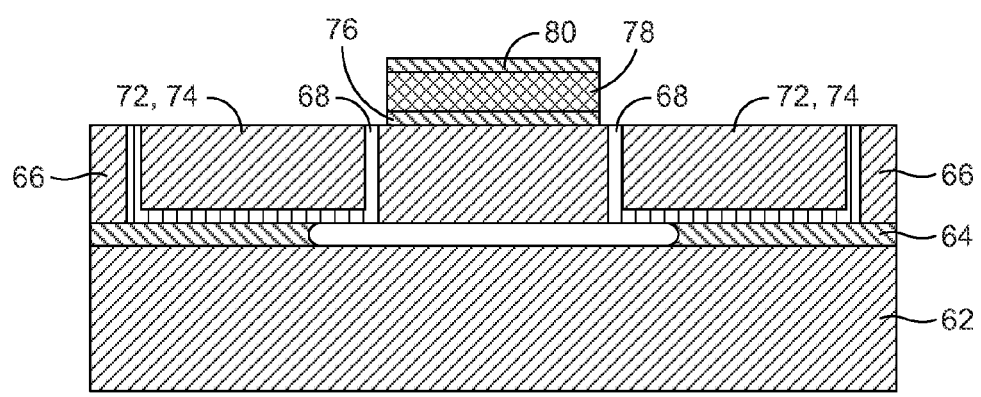

At this point, the piezoelectric material that extends beyond the edges of the top electrode 80 can be removed, for example, by etching, to produce the configuration shown in FIG. 4I, which is similar to that shown in FIG. 3.

Hybrid micromechanical resonators of the type described above can be used to provide a mode of operation that is not possible with conventional capacitive or piezoelectric resonators. As an example, a DC bias voltage can be applied to the capacitive resonator body (e.g., using the capacitive electrodes) to generate an electrostatic force that causes the body to resonate (vibrate). The vibration of the capacitive resonator body causes the piezoelectric material of the piezoelectric transducer on top of the resonator body to resonate and therefore generate a charge and a current, which can be sensed from the top electrode. Because the hybrid resonator is formed with capacitive and/or piezoelectric transducers and has multiple ports, the device offers great reconfigurability. In particular, the capacitive transducer offers easy on/off switchability by toggling the DC bias voltage. The possibility to implement split capacitive electrodes (ports) as well as split electrodes (ports) in the piezoelectric transducer allows the designer to control/reconfigure the input-to-output transform function of the resonator device, but also enables power splitting or power combining applications through the efficient use of the multiple ports. Moreover, given that the capacitive transducer ports and piezoelectric transducer ports can be strategically designed to offer different nonlinearity and phase transition, the operation of the hybrid resonator can be reconfigured to provide adjustable output characterstics in terms of the linearity and phase, in addition to power.

The invention claimed is:

1. A hybrid micromechanical resonator comprising:
   a capacitive resonator element; and
   a piezoelectric resonator element formed on top of the capacitive resonator element;
   wherein the resonator can be capacitively and piezoelectrically transduced.

2. The hybrid micromechanical resonator of claim 1, wherein the capacitive resonator element comprises a capacitive resonator body and capacitive electrodes, wherein the capacitive resonator body is isolated from the capacitive electrodes by capacitive gaps.

3. The hybrid micromechanical resonator of claim 2, wherein the capacitive gaps comprise dielectric material.

4. The hybrid micromechanical resonator of claim 2, wherein the capacitive gaps are air gaps.

5. The hybrid micromechanical resonator of claim 2, wherein the resonator is fabricated on a silicon-on-insulator (SOI) wafer comprising a handle layer, a buried oxide layer, and a device layer, wherein the resonator body comprises a portion of the device layer.

6. The hybrid micromechanical resonator of claim 5, wherein a portion of the buried oxide layer adjacent the resonator body is removed to form a cavity that enables the capacitive resonator body to resonate.

7. The hybrid micromechanical resonator of claim 1, wherein the piezoelectric resonator element comprises a bottom electrode, a top electrode, and a layer of piezoelectric material sandwiched between the electrodes.

8. A hybrid micromechanical resonator comprising:
   a capacitive resonator element including a capacitive resonator body and capacitive electrodes, wherein the capacitive resonator body is isolated form the capacitive electrodes by capacitive gaps; and
   a piezoelectric resonator element formed on top of the capacitive resonator body of the capacitive resonator element, the piezoelectric resonator element including a bottom electrode, a top electrode, and a layer of piezoelectric material sandwiched between the electrodes;
   wherein the resonator can be capacitively and piezoelectrically transduced.

9. The hybrid micromechanical resonator of claim 8, wherein the capacitive resonator body and the piezoelectric resonator element together form a hybrid resonator body.

10. The hybrid micromechanical resonator of claim 8, wherein the capacitive resonator body resonates in contour mode.

11. The hybrid micromechanical resonator of claim 10, wherein the capacitive resonator body is circular.

12. The hybrid micromechanical resonator of claim 8, wherein the piezoelectric resonator element resonates in contour mode.

13. The hybrid micromechanical resonator of claim 12, wherein the piezoelectric resonator element is circular.

14. The hybrid micromechanical resonator of claim 8, wherein the resonator is fabricated on a silicon-on-insulator (SOI) wafer comprising a handle layer, a buried oxide layer, and a device layer, wherein the resonator body comprises a portion of the device layer.

15. The hybrid micromechanical resonator of claim 14, wherein a portion of the buried oxide layer adjacent the resonator body is removed to form a cavity that enables the capacitive resonator body to resonate.

16. A method for fabricating a hybrid micromechanical resonator, the method comprising:
   forming a capacitive resonator element; and
   forming a piezoelectric resonator element on top of the capacitive resonator.

17. The method of claim 16, wherein forming a capacitive resonator element comprises forming a capacitive resonator body and capacitive electrodes, wherein the capacitive resonator body is isolated form the capacitive electrodes by capacitive gaps.

18. The method of claim 17, wherein forming a piezoelectric resonator element comprises forming on the capacitive resonator body a bottom electrode, a top electrode, and a layer of piezoelectric material sandwiched between the top and bottom electrodes.

19. The method of claim 18, wherein forming a capacitive resonator element comprises forming the capacitive resonator element from a silicon-on-insulator (SOI) wafer comprising a handle layer, a buried oxide layer, and a device layer, wherein the resonator body comprises a portion of the device layer.

* * * * *

UNITED STATES PATENT AND TRADEMARK OFFICE
CERTIFICATE OF CORRECTION

| | | |
|---|---|---|
| PATENT NO. | : 9,160,305 B1 | Page 1 of 1 |
| APPLICATION NO. | : 14/050860 | |
| DATED | : October 13, 2015 | |
| INVENTOR(S) | : Wu et al. | |

It is certified that error appears in the above-identified patent and that said Letters Patent is hereby corrected as shown below:

In the specification

Column 1, lines 12-18, should read

Notice of Government-Sponsored Research

This invention was made with government support under Grant Number 0925929 awarded by The National Science Foundation. The government has certain rights in the invention.

Signed and Sealed this
Ninth Day of August, 2016

Michelle K. Lee
*Director of the United States Patent and Trademark Office*